(12) United States Patent
Hellberg (10) Patent No.: US 7,145,387 B2
(45) Date of Patent: Dec. 5, 2006

(54) COMPOSITE POWER AMPLIFIER

(75) Inventor: Richard L. B. Hellberg, Huddinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 53 days.

(21) Appl. No.: 10/501,392

(22) PCT Filed: Dec. 13, 2002

(86) PCT No.: PCT/SE02/02320

§ 371 (c)(1),
(2), (4) Date: Jul. 15, 2004

(87) PCT Pub. No.: WO03/061115

PCT Pub. Date: Jul. 24, 2003

(65) Prior Publication Data

US 2006/0017500 A1    Jan. 26, 2006

(30) Foreign Application Priority Data

Jan. 16, 2002    (SE)    .................................... 0200127
Jul. 3, 2002    (SE)    .................................... 0202120

(51) Int. Cl.
H03F 3/68    (2006.01)
(52) U.S. Cl. ................................. 330/124 R
(58) Field of Classification Search ............... 330/107, 330/124 R, 126
See application file for complete search history.

(56) References Cited

U.S. PATENT DOCUMENTS

| | | | |
|---|---|---|---|
| 5,568,086 A | 10/1996 | Schuss et al. | 330/124 R |
| 5,901,346 A | 5/1999 | Stengel et al. | 455/126 |
| 6,054,896 A | 4/2000 | Wright et al. | 330/149 |
| 6,201,452 B1 * | 3/2001 | Dent et al. | 332/103 |
| 6,298,244 B1 * | 10/2001 | Boesch et al. | 455/553.1 |
| 6,825,719 B1 * | 11/2004 | Barak et al. | 330/129 |
| 6,897,721 B1 * | 5/2005 | Hellberg | 330/149 |
| 6,940,349 B1 * | 9/2005 | Hellberg | 330/124 R |

FOREIGN PATENT DOCUMENTS

| | | |
|---|---|---|
| WO | WO 01/91282 | 11/2001 |
| WO | WO 02/05421 | 1/2002 |
| WO | WO 02/39577 | 5/2002 |

OTHER PUBLICATIONS

H. Chireix; "High Power Outphasing Modulation;" Proceeding of the Institute of Radio Engineers; vol. 23, No. 11, Nov. 1935; pp. 1370-1392.

W. H. Doherty; "A New High Efficiency Power Amplifier for Modulated Waves;" Proceedings of the Institute of Radio Engineers; vol. 24, No. 9; Sep. 1936; pp. 1163-1182.

(Continued)

Primary Examiner—Steven J. Mottola
(74) Attorney, Agent, or Firm—Nixon & Vanderhye P.C.

(57) ABSTRACT

A composite power amplifier includes a first and a second power amplifier connected to an input signal over an input network and to a load over an output network. The output network includes phase shifting elements for generating different phase shifts from each power amplifier output to the common load. The input network includes means for driving both power amplifiers to produce first output current components having an amplitude that increases linearly with increasing output signal amplitude below a transition point (T.P) and decreases motonically with increasing output signal amplitude above said point, and second output current components having an amplitude that increases linearly with increasing output signal amplitude both below and above the transition point.

19 Claims, 10 Drawing Sheets

OTHER PUBLICATIONS

Frederick H. Raab; "Efficiency of Outphasing RF Power-Amplifier Systems;" IEEE Transactions on Communications, vol. COM-33, No. 10, Oct. 1985; pp. 1094-1099.

Bob. Stengel and William R. Eisenstadt; "LINC Power Amplifier Combiner Method Efficiency Optimization;" IEEE Transactions on Vehicular Technology, vol. 49, No. 1, Jan. 2000; pp. 229-234.

Xuejun Zhang and Lawrence E. Larson; "Gain and Phase Error-Free LINC Transmitter;" IEEE Transactions on Vehicular Technology, vol. 49, No. 5; Sep. 2000; pp. 1986-1994.

"Ampliphase AM Transmission System," ABU Technical Review, No. 33; Jul. 1974; pp. 10-18.

Irfan Ullah; "Output Circuit of an Ampliphase Broadcast Transmitter;" ABU Technical Review, No. 63; Jul. 1979; pp. 17-24.

Frederick H. Raab; "Efficiency of Doherty RF Power-Amplifier Systems;" IEEE Transactions on Broadcasting; vol. BC-33, No. 3; Sep. 1987; pp. 77-83.

David M. Upton and Peter R. Maloney; "A New Circuit Topology to Realize High Efficiency, High Linearity, and High Power Microwave Amplifiers;" IEEE Proc. Rawcon 1998; pp. 317-320.

International Search Report Feb. 20, 2003 in corresponding PCT Application PCT/SE2002/02320.

* cited by examiner

COMPOSITE POWER AMPLIFIER

This application is the US national phase of international application PCT/SE02/02320 filed 13 Dec. 2002, which designated the US and claims priority to SE Application No. 0200127-9 filed 16 Jan. 2002 and SE Application No. 0202120-2 filed 03 Jul. 2002. The entire contents of these applications are incorporated herein by reference.

TECHNICAL FIELD

The present invention relates generally to composite power amplifiers.

BACKGROUND

In many wireless communications systems, the power amplifier (PA) in the transmitter is required to be very linear, in addition to being able to simultaneously amplify many radio channels (frequencies) spread across a fairly wide bandwidth. It also has to do this efficiently, in order to reduce power consumption and need for cooling, and to increase its longevity. High linearity is required since nonlinear amplifiers would cause leakage of interfering signal energy between channels.

The amplitude probability density of a mix of sufficiently many independent radio frequency (RF) channels, or of a multi-user CDMA (Code Division Multiple Access) signal, tends to be close to a Rayleigh distribution having a large peak-to-average power ratio. Since a conventional RF power amplifier generally has an efficiency proportional to its output amplitude, its average efficiency is very low for such signals.

In response to the low efficiency of conventional linear power amplifiers, many methods have been proposed. Two of the most promising are the Chireix outphasing method [1] and the Doherty method [2]. Since their publication in 1935 and 1936, respectively, the theories, implementations and improvements of these two types of RF amplifier systems have remained separate from each other. The operation of the Chireix amplifier has thus been described in terms of constant-voltage operation of the constituent amplifiers, with outphasing of the constant-amplitude phasors as the method for obtaining amplitude modulation. The efficiency increasing action of the Doherty amplifier has been described in terms of (dynamic) impedance modulation of the load or, equivalently, variable load distribution.

At least three problems have been identified in these previously known composite power amplifiers.

Firstly, the output network of Chireix and Doherty amplifiers must be tuned with high precision to have the right properties at the desired frequency. This is a costly and time-consuming process, especially when large quantities of transmitters are to be produced.

Secondly, since their respective implementations are very different, the choice between making a Doherty and a Chireix amplifier must be made very early in the design process. It is also hard to change this decision later, since this involves a lot of redesign.

Thirdly, neither the Chireix nor the Doherty amplifier is suited for operation over multiple, relatively closely spaced bands (such as 1800/1900/2100 MHz).

In light of the problems just described, there is a need for an amplifier that can operate without excessive tuning of the output network. There is also a need for an amplifier platform, wherein the choice between a Chireix and a Doherty implementation can be made late in the design process, to match the advantages of the respective amplifying system with the requirements of the application. A need can also be identified for an amplifier that can function over multiple bands without redesign or retuning.

SUMMARY

An object of the present invention is a more flexible composite power amplifier, which can be used in both a Doherty and a Chireix type mode without excessive redesign or retuning.

Another object is an improved Chireix type composite amplifier.

These objects are achieved in accordance with the attached claims.

Briefly, the present invention provides a flexible, robust, possibly multi-band, efficient composite amplifier by applying several new techniques. The strategy is to converge the input and output network structures, and to control signal shaping of Doherty and Chireix amplifiers to make the drive signals as similar as possible. In addition to the pure Chireix and Doherty modes, efficient new operating modes that lie between and outside of these pure modes can also used. The resulting continuum of high-efficiency modes can be obtained by using one output network and a common way of operating the input network.

The modified output network can also be used in a new Chireix type composite amplifier, thereby eliminating the need for compensating reactances used in the prior art.

BRIEF DESCRIPTION OF THE DRAWINGS

The invention, together with further objects and advantages thereof, may best be understood by making reference to the following description taken together with the accompanying drawings, in which:

FIG. 5 is a diagram illustrating the relationship between the amplitudes of the linear/nonlinear output current components and the output voltage for a conventional Chireix amplifier;

FIG. 6 is a diagram illustrating the relationship between the linear/nonlinear output current components and the output voltage for a Chireix amplifier that has been modified in accordance with the present invention;

FIG. 10 is a diagram illustrating the relationship between power amplifier output current amplitudes and the output voltage for a conventional Doherty amplifier;

FIG. 11 is a diagram illustrating the relationship between the amplitudes of the linear/nonlinear output current components and the output voltage for a Doherty amplifier that has been modified in accordance with the present invention;

DETAILED DESCRIPTION

In the following description the same reference designations will be used for the same or similar elements throughout the figures of the drawings.

Furthermore, although they are not identical, the output networks of both Chireix and LINC amplifiers will be denoted Chireix type output network or combiner.

Figure 1:
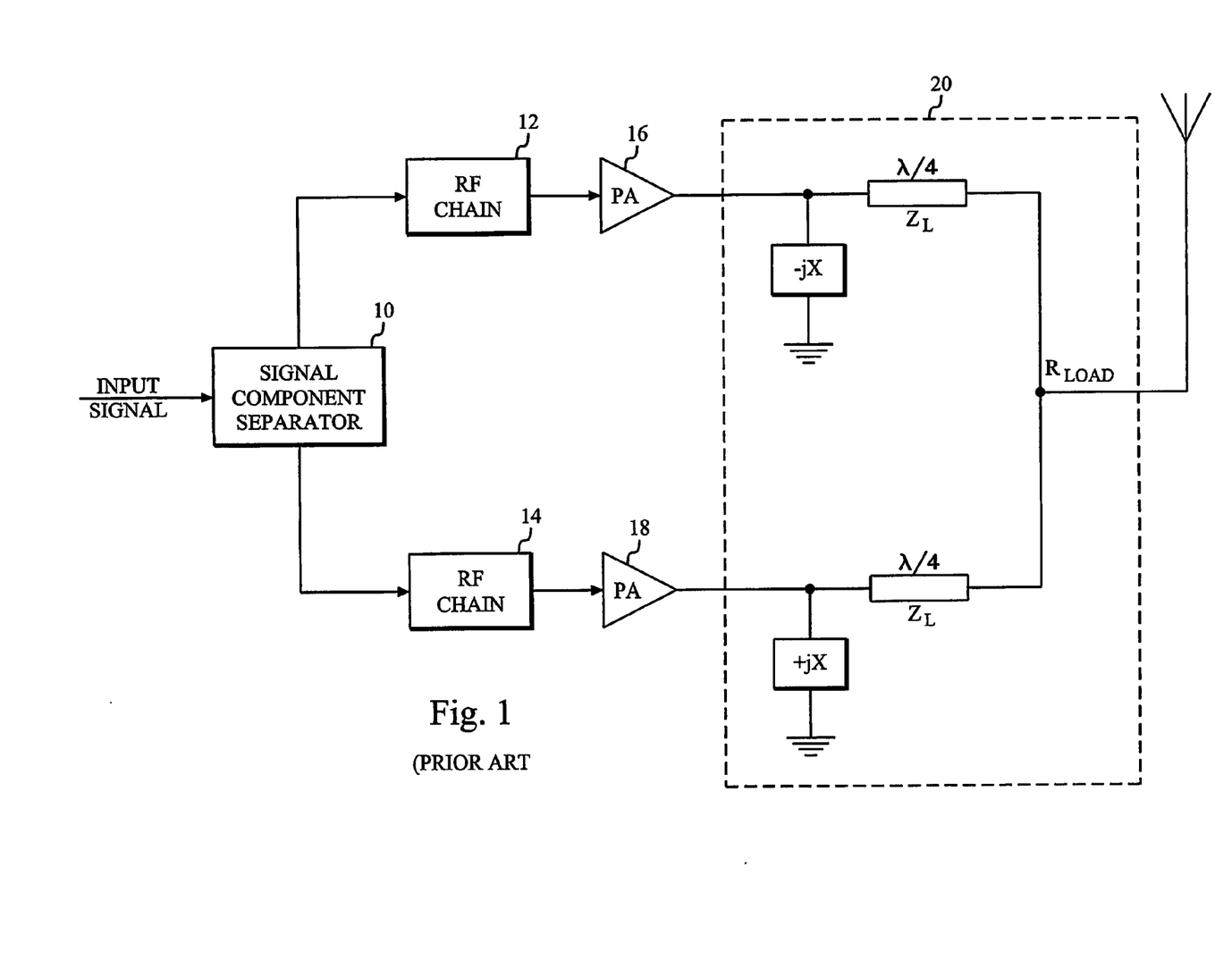
FIG. 1 is a block diagram of a typical prior art Chireix amplifier.

FIG. 1 is a block diagram of a typical prior art Chireix amplifier. The term "outphasing", which is the key method in Chireix and LINC amplifiers, generally means the method of obtaining amplitude modulation by combining two phase-modulated constant-amplitude signals produced in a signal component separator 10. After up-conversion and amplification through RF chains 12, 14 (mixers, filters, amplifiers) and power amplifiers 16, 18, the outphased signals are combined to form an amplified linear signal in a Chireix type output network 20. The phases of these constant-amplitude outphased signals are chosen so that the result from their vector-summation yields the desired amplitude. Output network 20 includes two quarter-wave lines λ/4 and two compensating reactances +jX and −jX, which are used to extend the region of high efficiency to include lower output power levels. In [3, 4] the efficiency of Chireix systems is analyzed. In [5, 6, 7] methods to overcome nonlinearity due to gain and phase imbalances are described. The Chireix method has also been used in broadcast transmitters under the trademark Ampliphase [6, 7].

An advantage of the Chireix amplifier is the ability to change the efficiency curve to suit different peak-to-average power ratios, by changing the size (X) of the reactances. The peak output power is equally divided between the amplifiers irrespective of this adjustment, which means that equal size (capacity) amplifiers can be used.

Figure 2:
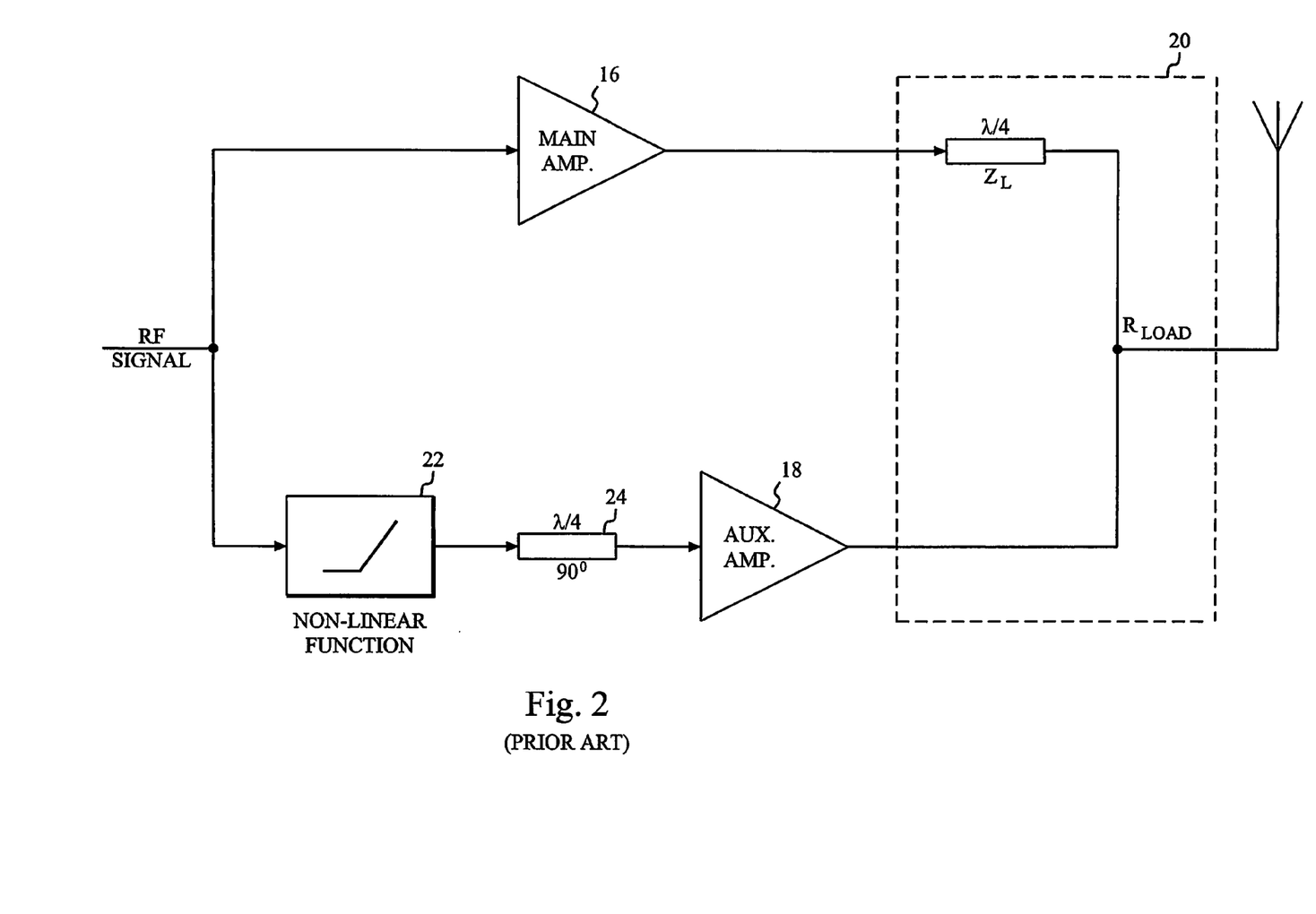
FIG. 2 is a block diagram of a typical prior art Doherty amplifier.

FIG. 2 is a block diagram of a typical prior art Doherty amplifier. The Doherty amplifier uses one linear and one nonlinear power amplifier. The published theory states that a main power amplifier 16 is driven as a linear amplifier in class B, and an auxiliary power amplifier 18 having nonlinear output current (through class C operation or some other technique represented by block 22) "modulates" the impedance seen by the main amplifier, through the impedance-inverting quarter-wave line [2, 10] in the output network 20. Since the nonlinear output current of the auxiliary amplifier is zero below a certain transition (output) voltage, the auxiliary amplifier does not contribute to the power loss below this voltage. An alternative output structure with built-in impedance matching is described in [11, 12].

The transition point of the standard Doherty amplifier is at half the maximum output voltage. With this transition point the efficiency curve is most suited for moderate peak-to-average power ratios, and the peak power is divided equally between the two constituent amplifiers. The transition point in the Doherty amplifier can be changed by changing the impedance of the quarter-wave transmission line (or equivalent circuit). The efficiency curve can then be adjusted for higher peak-to-average power ratios, and the peak output power will be unequally divided between the amplifiers. Different size amplifiers will thus be needed for optimum utilization of the available peak power.

Although the concepts of the Chireix and Doherty amplifiers are very different, it will be shown below that by proper modification of the input and output networks, it is in fact possible to combine these concept into a very efficient composite power amplifier.

Figure 3:
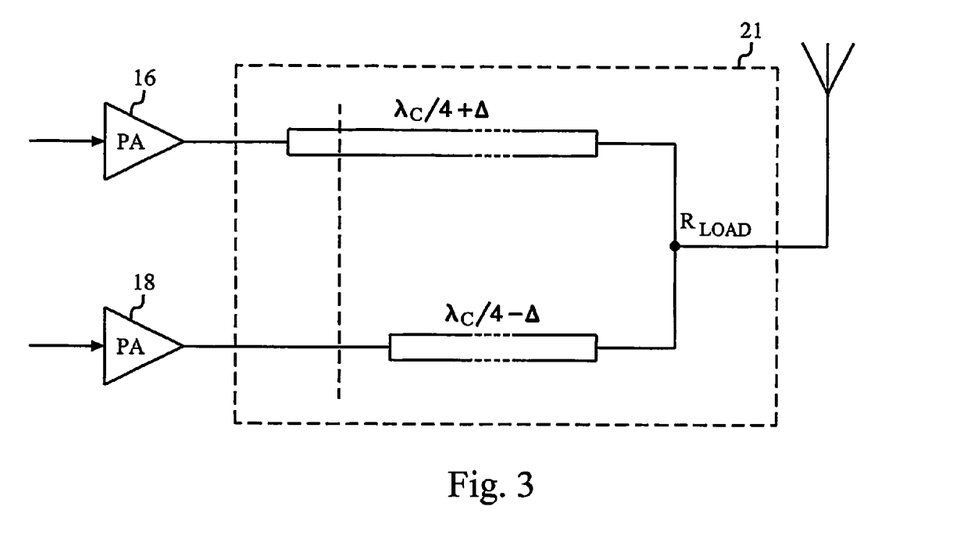
FIG. 3 is a block diagram illustrating a Chireix output network that has been modified in accordance with the present invention.

A first step towards this new composite amplifier is to alter the structure of the output network of the Chireix amplifier to get rid of the reactances +jX and −jX. This can be done by using shortened and lengthened versions of the quarter wavelength lines used in the prior art. The impedance $Z_L$ of these is the optimum load impedance $R_{opt}$ for a class B amplifier, and the load impedance $R_{LOAD}$ should be half this value. The shortened and lengthened (by equal amounts Δ) transmission lines act as quarter wave lines with the appropriate reactances. The new output network structure is illustrated in FIG. 3 as output network 21.

Figure 4:
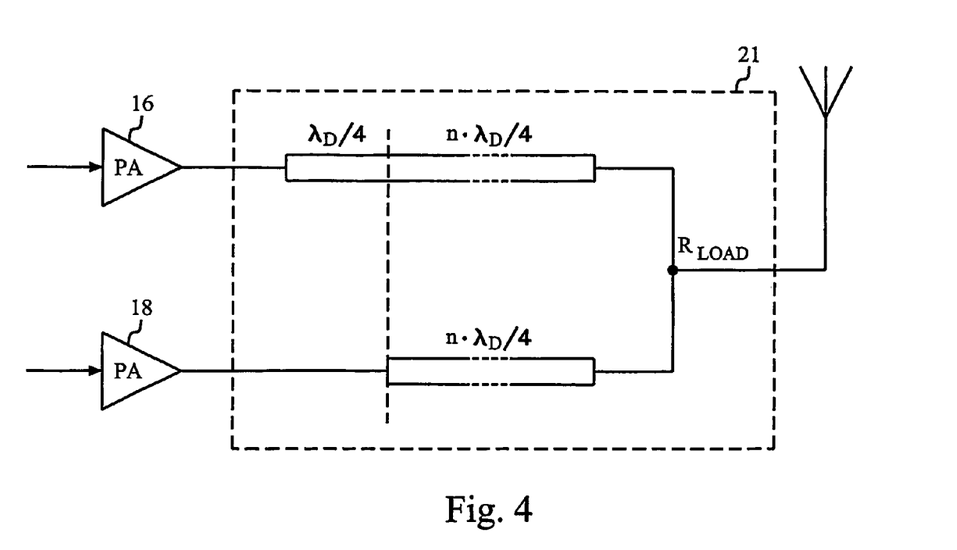
FIG. 4 is a block diagram illustrating the output network of FIG. 3 used as a Doherty output network.

If the frequency of operation is changed, this output network structure can be used also for making Doherty amplifiers, as illustrated in FIG. 4. The criteria that have to be fulfilled are:

1. The length difference between the two transmission lines should be ¼ of the Doherty amplifier wavelength $\lambda_D$.
2. The total transmission line length around the output network should be $(2n+1)*\lambda_D/4$, where n is a positive integer.

For example, if the electrical lengths of the lines are $\lambda_C/6$ and $\lambda_C/3$, respectively, at the Chireix operating frequency, there is a Doherty operating mode at 1.5 times the Chireix frequency, where the electrical lengths of the transmission lines are instead $\lambda_D/4$ and $\lambda_D/2$, and where $\lambda_C=1.5\lambda_D$. This can be seen (using FIGS. 3 and 4) by solving the equations:

$$2\Delta = \frac{\lambda_C}{3} - \frac{\lambda_C}{6}$$

$$2\Delta = \frac{\lambda_D}{4}$$

This gives $\lambda_C=1.5\lambda_D$. The total transmission line length around the Doherty network is (the total length is the same in both cases):

$$\frac{\lambda_C}{6} + \frac{\lambda_C}{3} = \frac{\lambda_C}{2} = \frac{3\lambda_D}{4}$$

which means that the second criterion is also fulfilled.

At 2 times the first Chireix operating frequency, there is another Chireix mode. Other relations between the lengths of the lines give rise to other (sometimes useful) patterns of modes. Of course, the different modes can also be placed at the same frequency, by changing the physical lengths of the transmission lines. For obtaining the Doherty mode, the lengths of the transmission lines of the modified Chireix network are thus multiplied by a factor 1.5.

A second step towards the new composite amplifier in accordance with the present invention is to alter the structure of the input network. Before this new structure is described it is useful to first describe typical prior art Chireix and Doherty input network structures.

The Chireix amplifier drive signals from signal component separator 10 in FIG. 1 include a linear plus or minus a nonlinear component (plus to one power amplifier and minus to the other power amplifier). These components are illustrated in FIG. 5. By separating each constant-amplitude phase-modulated signal from a standard signal component separator 10 into a linear part and a modified nonlinear part, changing the amplitude and phase of these components individually according to a set of specific rules, and recombining the parts into a signal with new properties, it is possible to obtain a Chireix type amplifier with substantially lower drive power consumption than the standard Chireix amplifier.

FIG. 6 is a diagram similar to FIG. 5 illustrating the modification in accordance with the present invention. The basic idea of the modification is to drive the composite amplifier linearly below a certain transition point T.P. In an ordinary Chireix amplifier the amplitude of the drive signal is constant, and the phase difference between the amplifiers is used to generate amplitude modulation at the output. Below the transition point this leads to excessive current consumption, because the voltage and current at each power amplifier will become more and more out of phase. The output power decreases but the transistor RF current (which can be translated to DC current) will not decrease. Thus, at some point (defined below) it is better to decrease the drive, and keep the phase difference constant, instead of continuing with outphasing action.

In order to generate the drive signals, it is first necessary to calculate the transition point where the amplifier should go from outphasing to linear operation. This point can easily be identified in a Chireix amplifier current plot (or a plot of amplifier efficiency) as the point where a straight line through the origin touches the current curve. It is also possible to calculate the point analytically.

It is also possible to use a linear approximation of the circle segment, as indicated by the dashed line in FIG. 6, without loosing much efficiency. Below the transition point the phase difference between the drive signals is kept constant, and the amplitude is decreased linearly toward zero in order to maximize efficiency.

Figure 7:
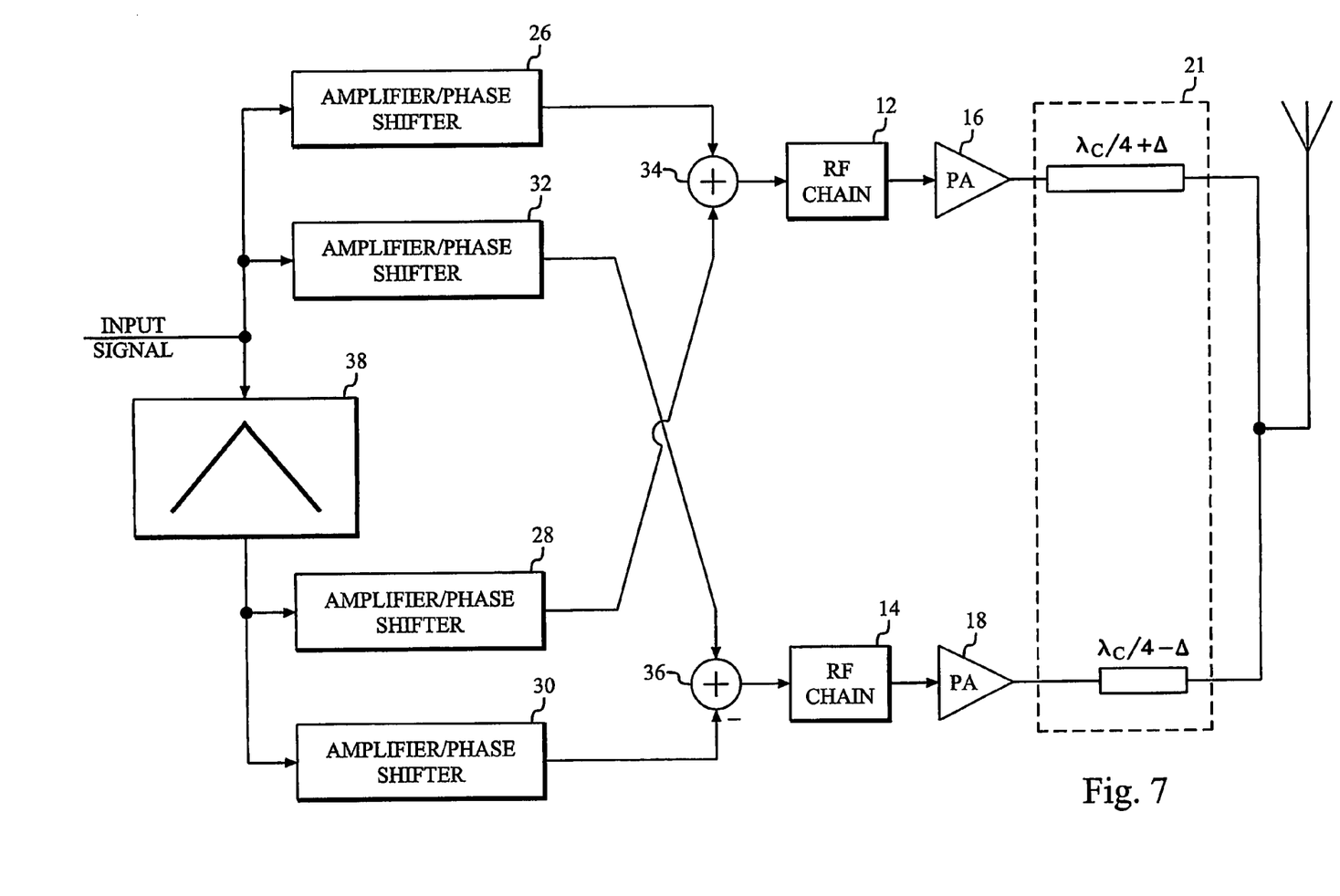
FIG. 7 is a block diagram of an exemplary embodiment of a Chireix amplifier in accordance with the present invention.

FIG. 7 is a block diagram of an exemplary embodiment of a Chireix amplifier in accordance with the present invention. The linear drive signal components are produced by amplifier/phase shifter 26 and 32 directly from the input signal. Similarly, nonlinear drive signal components are generated by a nonlinear element 38 and amplifier/phase shifter 28 and 30. The amplitude dependence is linear up to the transition point T.P., and follows a linear approximation of the circle segment after the transition point. Unit 38 may, for example, be implemented as a combination of a lookup table followed by D/A converters in which a digital input signal amplitude is transformed into the proper drive signals (the input signal amplitude is assumed to be proportional to the composite amplifier output voltage amplitude). However, analog implementations are also possible. The nonlinear signal from amplifier/phase shifter 28 is added to the linear signal component from amplifier/phase shifter 26 in an adder 34, while the nonlinear signal from amplifier/phase shifter 30 is subtracted from the linear signal component from amplifier/phase shifter 32 in an adder 36. In an analog embodiment adders 34, 36 may, for example, be realized as hybrids. In a digital embodiment they are digital adders. As indicated by an antenna, the composite amplifier may be part of a transmitter, for example a transmitter in a radio terminal, such as a base station or a mobile station in a cellular mobile radio communication system.

It is appreciated that each of the drive signal components will include a common phase component. For this reason only three of the phases actually have to be adjusted.

A method of adjusting the amplitudes and phases of the linear parts (which does not assume an ideal balanced output network) is to adjust them to obtain maximum power output and maximum efficiency at the maximum input excitation level (with otherwise linear behavior). This can be done in a model of the amplifier, to obtain adjustment factors, or in the amplifier itself. The result of this operation is amplifier performance and efficiency similar to a class-B amplifier using the same transistors.

In this embodiment the amplitudes and phases of the nonlinear signal components are adjusted in order to minimize the average current consumption. This condition usually allows at least one of the transistors to have constant and maximum output voltage. Since this procedure should preferably be performed while ensuring linearity in the output, the amplified nonlinear signals should cancel each other at the output. As will be shown below, it is possible to achieve such a cancellation. However, in order to explain how this is done, it will be necessary to introduce a model of the output network.

Figure 8:
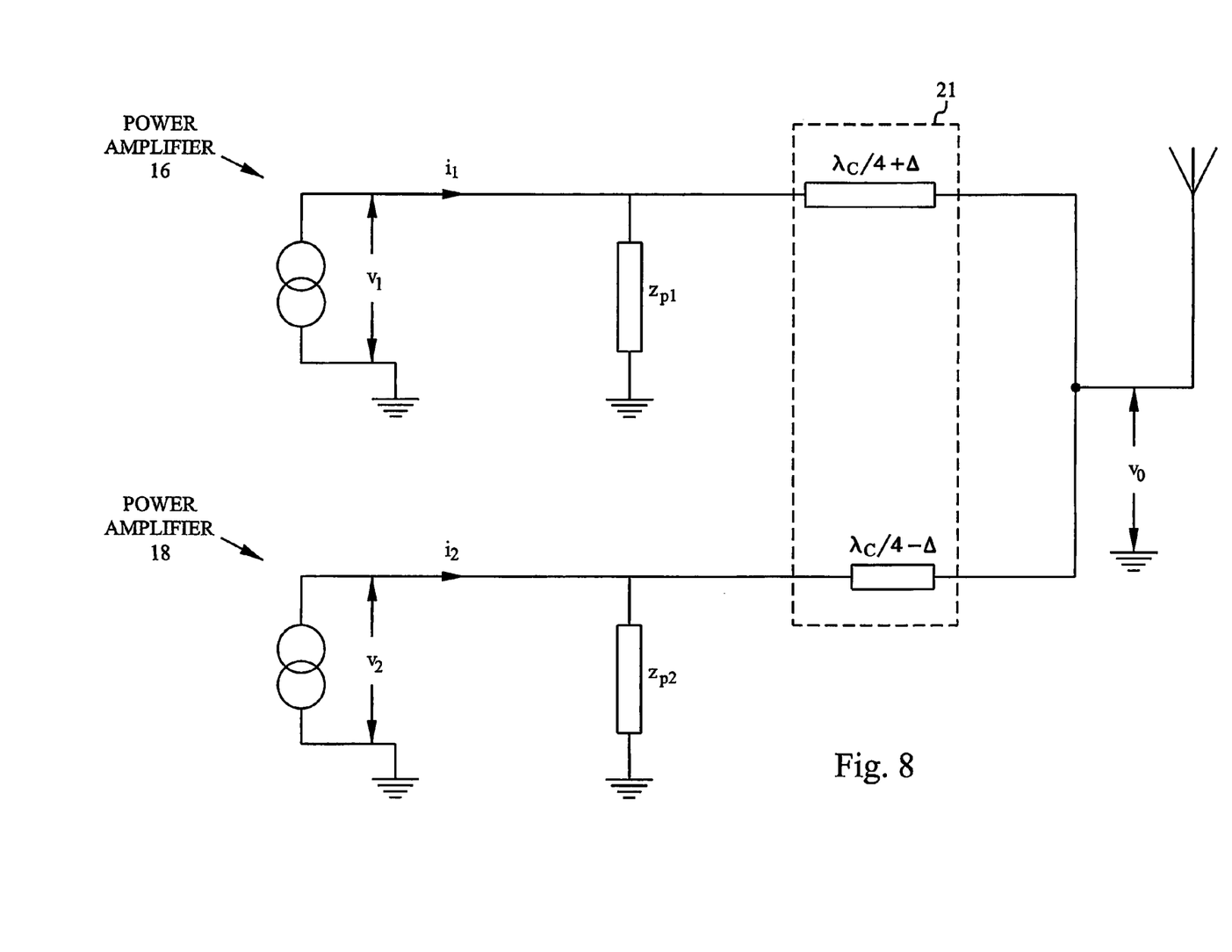
FIG. 8 is a model of the modified Chireix amplifier output network.

FIG. 8 illustrates such an output network model. In this model the active part of the amplifier transistor outputs are modeled as linear controlled current generators. The finite output conductances of the transistors are denoted $z_{p1}$ and $z_{p2}$, respectively. A quantity of special interest is how RF currents from the output nodes of amplifiers 16 and 18 transform into voltages at the output node of the composite amplifier. This quantity is represented by the output transimpedances $$z_{o2} = \frac{v_0}{i_2}\bigg|_{i_1=0} \quad z_{o1} = \frac{v_0}{i_1}\bigg|_{i_2=0}$$

Assuming that all components are reasonably linear, superposition can be used for analyzing this model.

Since the output network (including combiner 21 and input lines to this combiner) may be unbalanced, it follows that $z_{o1}$ may be different from $z_{o2}$. Since the nonlinear signal parts should cancel each other at the output, it is required that the linearity condition $$q_1 \cdot z_{o1} + q_2 \cdot z_{o2} = 0 \tag{1}$$

is fulfilled, where $q_1$ and $q_2$ are the adjusted nonlinear components. The condition is possible since the nonlinear parts are identical, except for the sign (thus, it is possible to replace elements 28, 30 by a single amplifier/phase shifter 28). A simple way to fulfil this condition is have a compensating filter in one of the nonlinear branches, for example $z^{o1}*z_{o2}^{-1}$ in the lower branch (here "*" denotes convolution in the time domain and multiplication in the frequency domain). By inserting wideband, frequency-dependent transimpedances $z_{o1}$ and $z_{o2}$ into the linearity condition, linearity in the output is obtained over a wide bandwidth. Thus the nonlinear part will cancel in the output for all frequencies within some specified bandwidth.

Another way to fulfill condition (1) is to insert the filter $z_{o2}$ in the upper branch and the filter $z_{o1}$ in the lower branch. In this way both branches will be subjected to the composite filter $z_{o1}*z_{o2}$.

FIG. 10 is a diagram illustrating the relationship between output current and output voltage for an ideal conventional Doherty amplifier. Main power amplifier 16 is driven by a linear signal, whereas auxiliary power amplifier 18 is driven by a nonlinear signal, which is zero up to the transition point T.P. and varies linearly thereafter. Thus in a conventional Doherty amplifier one amplifier is driven by a linear signal and the other amplifier is driven by a nonlinear signal, which is very different from a conventional Chireix amplifier, in which both amplifiers are driven by signals that include both linear and nonlinear components.

Figure 9:
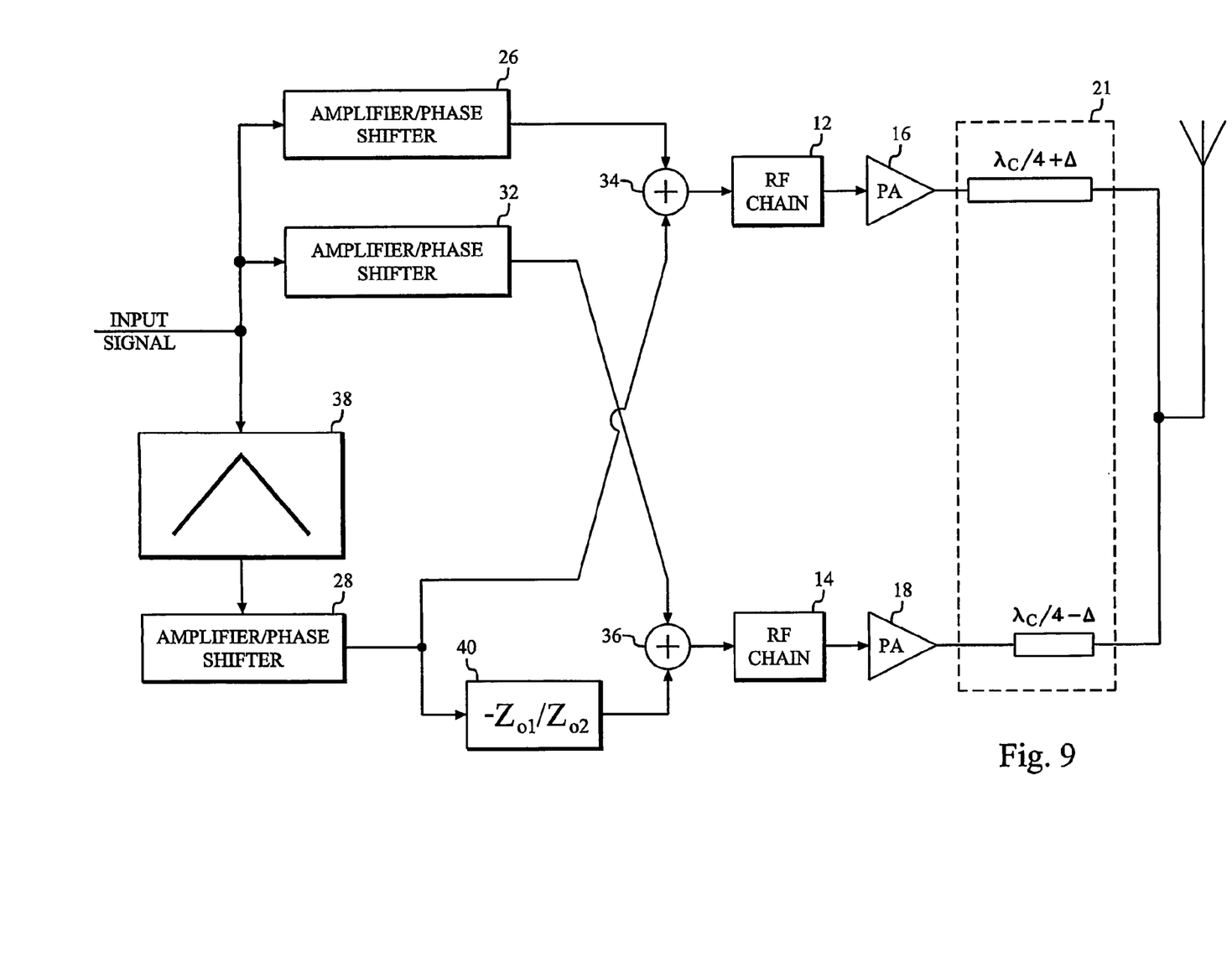
FIG. 9 is a block diagram of another exemplary embodiment of a Chireix amplifier in accordance with the present invention.

FIG. 11 is a diagram illustrating the relationship between output current components and output voltage for a Doherty amplifier that has been modified in accordance with the present invention. The idea of this modification is to drive both amplifiers with a linear and a nonlinear drive signal component, just as in the Chireix case described above. This will (ideally) give the same output currents from each power amplifier as in FIG. 10. With this modification it is possible to drive the input network of a Doherty amplifier in the same way as the modified Chireix amplifier described above (but at another frequency). Thus, the same input network structure as in FIG. 9 may be used also for the modified Doherty amplifier.

Thus, it is possible to use a unified control strategy for both Chireix and Doherty type of amplifiers. The central result of the developed theory for linear, wideband operation of Doherty and Chireix amplifiers is that the nonlinear parts of the input to the output stage amplifiers should and can be cancelled in the composite amplifier output node.

When the triangular (or partially curved or partially monotonically decreasing) nonlinear "basis function" is used, the linear operation up to the maximum amplitude in the output is obtained by application of the linear basis function alone. When only the linear basis function is present, all RF voltages in the system are less than or equal to their end values since they depend linearly on this function. The magnitudes and gains of the paths for the linear basis function can then be adjusted for achieving a partial objective, i.e. maximum peak power in the output, without the need for adjusting the paths for the nonlinear (triangular) function. This usually means to adjust for the sum of the peak powers of the individual constituent amplifiers, if the output network is properly designed. The amplifier (without the effect of the triangular basis function) then works as an optimal class B amplifier. This is possible for the unified Chireix-Doherty output network of the present invention at all frequencies.

The paths for the nonlinear basis function can be arbitrarily adjusted, without showing in the output, as long as condition (1) is met. An additional requirement is of course that nonlinear effects, such as saturation of the amplifiers, do not come into play in any significant way. The objective here is to minimize the D.C. power (i.e. current) consumption, by setting the right magnitude and phase for the nonlinear basis function paths, under these conditions. This maximizes the efficiency. The RF voltages are generally altered at both of the output amplifiers as a result, but as long as the voltages lie inside the maximum allowed, this has no major consequences. Another parameter that can be adjusted is the transition point T.P. where the output voltage of the triangular basis function has its maximum. This can be used for example if the optimum transition voltage is not known beforehand. In conjunction with this adjustment, an adjustment of the shape of the nonlinear basis function (to a curved shape) can, if necessary, be incorporated.

The just described control strategy has the advantages that it can be used for all composite amplifiers, that the peak output power can be independently optimized, and that the efficiency maximization does not affect the output signal.

Figure 12:
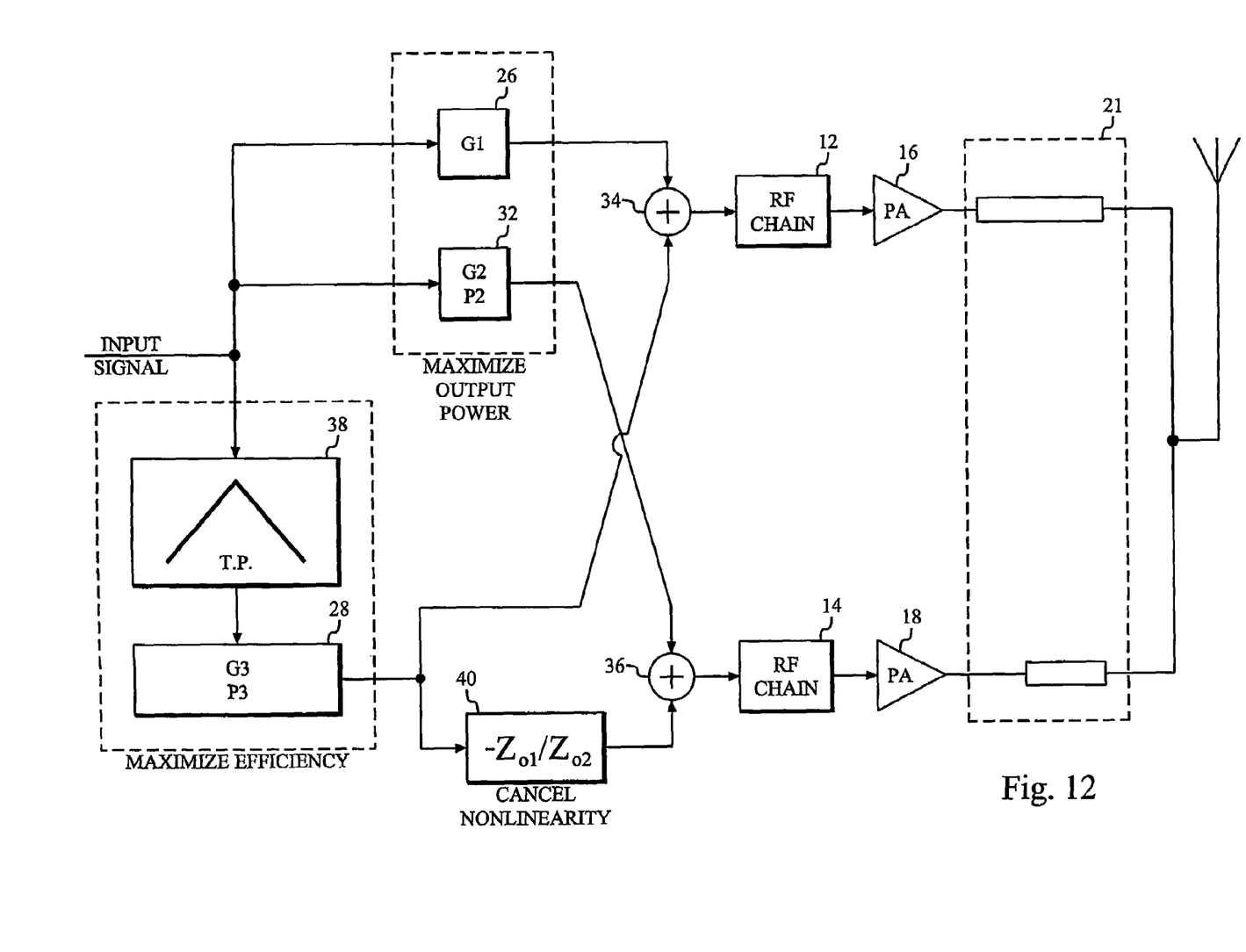
FIG. 12 is a block diagram of an exemplary embodiment of a composite amplifier in accordance with the present invention.

The resulting structure, with provisions for the adjustments, is shown in FIG. 12. The letter G implies a gain, P stands for phase, and T.P. means transition point. The phase of the linear part to one of the amplifiers can (as mentioned above) be left out of the adjustments. These adjustments are for one frequency or operating mode only. If wideband operation is desired, the further methods of [13] can be used.

Although the input network in FIG. 12 is provided before RF chains 12, 14, it is appreciated that the same principles may also be applied anywhere in or after these chains.

The unified control strategy using the triangular and linear basis functions works for all composite amplifiers. Amplifiers with the unified output network are, at all frequencies, composite amplifiers with at least class B operation possible. It is easy to see that the output network functions as an in-phase combiner, as long as the signals from the two amplifiers are delayed by amounts that compensate for the electrical length difference between the lines leading to the load. This means that it is possible to get linear class B performance from the network at all frequencies. At some (singular) frequencies class B is the best possible operating mode, but at all other frequencies efficiency can be increased by at least some amount compared to class B operation, using the methods proposed above.

Figure 13:
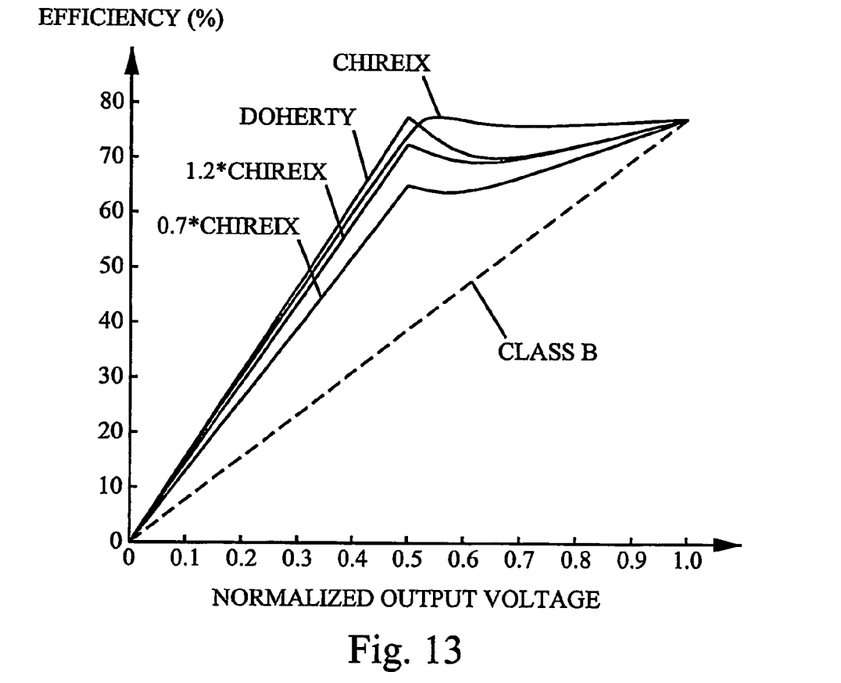
FIG. 13 is a diagram illustrating the efficiency of a composite amplifier in accordance with the present invention for different modes of operation.

The first class B mode, except the trivial one at zero frequency, is found (for the example network with transmission lines having an electrical length of $\lambda_C/3$ and $\lambda_C/6$) at three times the frequency of the first Chireix mode. This means that at all frequencies between these two modes, it is possible to increase efficiency. In practice the possible increase in efficiency is not very great at frequencies close to the class B frequencies. However, for the example network, efficiency comparable to the efficiencies at the first pure Chireix modes (at the first Chireix frequency and an octave above) and the first Doherty mode (at 1.5 times the first Chireix frequency) can be obtained all the way from approximately 0.7 to 2.3 times the first Chireix frequency. This is more than a 3-to-1 bandwidth. Efficiency curves, when using the same (triangular) basis function, for the Chireix mode, Doherty mode, and modes at 0.7 times and 1.2 times the Chireix mode frequencies, are shown in FIG. 13. For comparison, the efficiency of a class-B amplifier has also been indicated by a dashed line.

Figure 14:
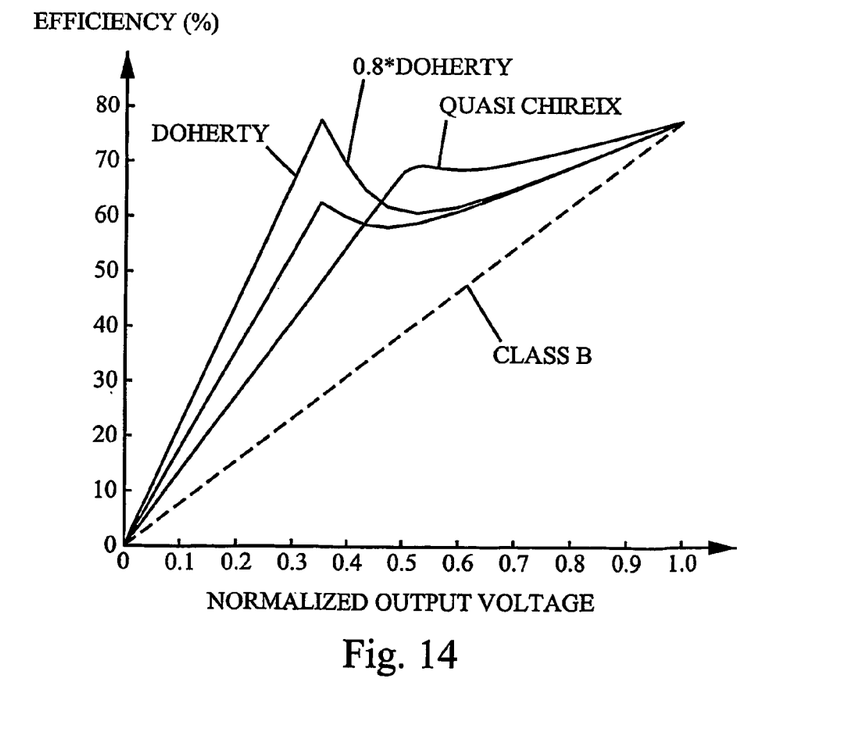
FIG. 14 is a diagram illustrating the efficiency of an asymmetrical composite amplifier in accordance with the present invention for different modes of operation.

As an example of a similar network with different properties it is possible to use power amplifiers with asymmetrical capacity. We keep the lengths of the transmission lines from the previous example, i.e. a 1:2 relation. With the first amplifier having 56% of the capacity (output current capacity at equal supply voltages) of the second amplifier, we need, for optimal combination, the load to be 64% of the optimal load for the second amplifier. The transmission lines each have an impedance equal to the optimal load of the respective amplifier. The example network is a Doherty network at the frequency where the transmission line from the first amplifier to the load is one-quarter wavelength, and the second transmission line is a half wavelength. The optimal transition point for this Doherty mode is at 0.36 of the maximum output voltage and gives ideally 60% average efficiency for the 10-dB peak-to-average Rayleigh amplitude distribution it is optimized for. What we have then at the "Chireix frequencies", at two thirds and one and a third of the Doherty frequency, are quasi-Chireix modes having optimum transition points and corresponding efficiency curves comparable to a Doherty amplifier with equal size amplifiers. An interesting point is that, although these modes are at the Chireix frequencies, operation as a traditional Chireix amplifier is not possible. This is because the amplifier capacities (and the network branches) are asymmetric, so the traditional Chireix criterion of balance between the paths is not fulfilled and the amplifier would therefore be nonlinear. The efficiency curves (using triangular basis functions with different transition points) for the Doherty mode, an intermediate mode at 0.8 times the Doherty frequency, and one of the quasi-Chireix modes are shown in FIG. 14.

The description so far has dealt with somewhat idealized output networks. In practice, the harmonics or overtones of the collector (or drain) voltages of the class-B amplifier must be terminated in certain ways, to make full use of the transistors. For example, the first overtone must be terminated by short-circuiting the collector to RF ground at the first overtone frequency. The network that takes care of this is usually bandlimited, both at the useful (fundamental) and terminating (first overtone) frequencies. This means that, in general, we get a continuous band of high-efficiency modes within the bandwidth limits set by the harmonic termination requirements. However, to say that the networks "themselves" can be used in a 3-to-1 bandwidth with the described methods, is the same as to say that the transmission line lengths of the network can be anywhere within a 1-to-3 span when used at a single frequency, as long as the harmonic termination is correct for this frequency. The tolerance requirements can thus be very relaxed.

Pure transmission line ("distributed") implementations of the output networks are presently preferred for achieving a wide useful bandwidth of high-efficiency modes. Output networks for different modes, or bands of modes, can alternatively be implemented with lumped elements or combinations of lumped and distributed elements.

The described control scheme can be used to good effect with all traditional Chireix and Doherty networks, as well as all mistuned and otherwise badly behaved variants of these. A major part of the hardware can therefore be made independently of what type of output network it is to be used with. This means that a common flexible amplifier "platform" can be built, from which different properties can be obtained by small changes in the output network. It is easy to change between different Doherty and Chireix output networks, and optimized output networks for different peak-to-average power ratios can be interchanged without modifications to the rest of the hardware.

The ability of the proposed method to cope with any composite amplifier output network, and produce an amplifier with near-optimum efficiency under these circumstances, makes the amplifier robust. This means that possible mistuning of the output network is of minor consequence, and last-minute changes are not very hazardous. The proposed networks themselves are also highly robust against mistuning, since a very wide band of high efficiency operation can be achieved. If variants of an amplifier for different systems are still needed, they can be built for very little extra cost. Operation of the amplifier in multiple bands, within the limits set by the requirement for harmonic termination, can easily be achieved.

New high-efficiency operating modes (until now unknown) and networks for achieving these modes have been identified. Especially interesting is the ability to operate in a quasi-Chireix mode with unequal capacity of the constituent power amplifiers. High-efficiency modes located continuously between Doherty and Chireix modes, or between Chireix modes, are also useful, particularly as a complement to the Chireix and Doherty modes.

The efficiency enhancement is separated from the linear amplifier adjustments, and also "invisible" to the output. The number of parameters to adjust is also rather low. This means that the control scheme is a good candidate for dynamically adaptive adjustment.

In summary, the proposed output networks enable production of efficient, robust amplifiers without much need for trimming and provide multi-band operation and new, useful high-efficiency modes. The unified control scheme with converged basis functions gives a high tolerance to mistuning and enables common amplifier platforms, easily changed output networks and adaptive adjustment. These two parts of the invention can be used separately with great benefits. However, the combination of the two increases their respective abilities. Thus, although the described modified output network is preferably used in a composite amplifier that also has the described modified input network, this modified output network is in itself an improvement also in a pure Chireix type of amplifier, since it eliminates the need for the reactances used in prior art Chireix amplifiers.

It will be understood by those skilled in the art that various modifications and changes may be made to the present invention without departure from the scope thereof, which is defined by the appended claims.

REFERENCES

[1] H. Chireix, "High Power Outphasing Modulation", Proc. IRE, vol. 23, no. 2, pp. 1370–1392, November 1935.
[2] W. H. Doherty, "A New High Efficiency Power Amplifier for Modulated Waves", Proc. IRE, vol. 24, no. 9, pp. 1163–1182, September 1936.
[3] F. H. Raab, "Efficiency of Outphasing RF Power Amplifier Systems", IEEE Trans. Communications, vol. COM-33, no. 10, pp. 1094–1099, October 1985.
[4] B. Stengel and W. R. Eisenstadt, "LINC Power Amplifier Combiner Method Efficiency Optimization", IEEE Trans. Vehicular Technology, vol. 49, no. 1, pp. 229–234, January 2000.
[5] X. Zhang and L. E. Larson, "Gain and Phase Error-Free LINC Transmitter", IEEE Trans. Vehicular Technology, vol. 49, no. 5, pp. 1986–1994, September 2000.
[6] A. S. Wright, S. J. Bennett, U.S. Pat. No. 6,054,896.
[7] R. E. Stengel, S. A. Olson, U.S. Pat. No. 5,901,346.
[8] "Ampliphase AM Transmission System", ABU Technical Review, no. 33, pp. 10–18, July 1974.
[9] I. Ullah, "Output Circuit of an Ampliphase Broadcast Transmitter", ABU Technical Review, no. 63, pp. 17–24, July 1979.
[10] F. H. Raab, "Efficiency of Doherty RF Power Amplifier Systems", IEEE Trans. Broadcasting, vol. BC-33, no. 3, pp. 77–83, September 1987.
[11] D. M. Upton et al. "A New Circuit Topology to Realize High Efficiency, High Linearity, and High Power Microwave Amplifiers", IEEE Proc. RAWCON '98, pp. 317–320.
[12] J. J. Schuss et al., U.S. Pat. No. 5,568,086, October 1996.
[13] WO 02/05421 A1, Telefonaktiebolaget LM Ericsson.

The invention claimed is:

1. A composite power amplifier including a first and a second power amplifier connected to an input signal over an input network and to a common load over an output network; and circuitry in said input network for driving both power amplifiers to produce first output current components having an amplitude that increases linearly with increasing output signal amplitude below a predetermined transition point and decreases monotonically with increasing output signal amplitude above said transition point, and second output current components having an amplitude that increases linearly with increasing output signal amplitude both below and above said transition point.

2. The amplifier of claim 1, including phase shifting elements in said output network for generating different phase shifts from each power amplifier output to said common load.

3. The amplifier of claim 1, including circuitry for driving both power amplifiers to produce first output current components having an amplitude that increases linearly with increasing output signal amplitude below said predetermined, transition point.

4. The amplifier of claim 1, including amplifiers and phase shifters for maximizing output power.

5. The amplifier of claim 1, including circuitry for maximizing power amplifier efficiency.

6. The amplifier of claim 1, including a filter for canceling nonlinearity in the output signal.

7. A method of driving a composite power amplifier including a first and a second power amplifier connected to an input signal over an input network and to a common load over an output network, said method including the step of driving both power amplifiers to produce first output current components having an amplitude that increases linearly with increasing output signal amplitude below a predetermined transition point and decreases monotonically with increasing output signal amplitude above said transition point, and second output current components having an amplitude that increases linearly with increasing output signal amplitude both below and above said transition point.

8. The method of claim 7, including the step of generating different phase shifts from each power amplifier output to said common load.

9. The method of claim 7, including the step of driving both power amplifiers to produce first output current components having an amplitude that increases linearly with increasing output signal amplitude below said predetermined transition point.

10. The method of claim 7, including the steps of amplifying and phase shifting drive signals to said power amplifiers for maximizing output power.

11. The method of claim 7, including the step of adjusting drive signals to said power amplifiers for maximizing power amplifier efficiency.

12. The method of claim 7, including the step of filtering drive signals to said power amplifiers for canceling nonlinearity in the output signal.

13. The method of claim 7, including the steps of independently amplifying and phase shifting drive signals to said power amplifiers for maximizing output power; adjusting drive signals to said power amplifiers for maximizing power amplifier efficiency; and filtering drive signals to said power amplifiers for canceling nonlinearity in the output signal.

14. A radio terminal including a composite power amplifier, which includes a first and a second power amplifier connected to an input signal over an input network and to a common load over an output network; and circuitry in said input network for driving both power amplifiers to produce first output current components having an amplitude that increases linearly with increasing output signal amplitude below a predetermined transition point and decreases monotonically with increasing output signal amplitude above said transition point, and second output current components having an amplitude that increases linearly with increasing output signal amplitude both below and above said transition point.

15. The terminal of claim 14, including phase shifting elements in said output network for generating different phase shifts from each power amplifier output to said common load.

16. The terminal of claim 14, including means for driving both power amplifiers to produce first output current components having an amplitude that increases linearly with increasing output signal amplitude below said predetermined transition point.

17. The terminal of claim 14, including amplifiers and phase shifters for maximizing output power.

18. The terminal of claim 14, including means for maximizing power amplifier efficiency.

19. The terminal of claim 14, including a filter for canceling nonlinearity in the output signal.

* * * * *